United States Patent [19]

Steinberg

[11] Patent Number: 4,868,034
[45] Date of Patent: Sep. 19, 1989

[54] NON-OXIDIZING COPPER THICK FILM CONDUCTORS

[75] Inventor: Jerry I. Steinberg, Wilmington, Del.

[73] Assignee: Heraeus Incorporated Cermalloy Division, West Conshohocken, Pa.

[21] Appl. No.: 154,729

[22] Filed: Feb. 11, 1988

[51] Int. Cl.$^4$ .............................................. B32B 5/16
[52] U.S. Cl. .................................. 428/403; 428/209; 428/901; 428/469; 428/704; 428/212; 106/1.18; 252/512; 252/518; 252/521
[58] Field of Search ............... 106/1.18; 252/512, 518, 252/521; 428/403, 209, 901, 212, 469, 704

[56] References Cited

U.S. PATENT DOCUMENTS

| | | | |
|---|---|---|---|
| 3,881,914 | 5/1975 | Heidelberg | 75/0.5 A |
| 3,929,674 | 12/1975 | Patterson | 252/514 |
| 3,988,647 | 10/1976 | Bolon et al. | 252/514 |
| 4,001,146 | 1/1977 | Horowitz | 252/514 |
| 4,070,518 | 1/1978 | Hoffman | 252/512 |
| 4,072,771 | 2/1978 | Grier, Sr. | 252/512 |
| 4,090,009 | 5/1978 | Horowitz | 252/514 |
| 4,172,919 | 10/1979 | Mitchell | 428/209 |
| 4,323,483 | 4/1982 | Rellick | 252/512 |
| 4,477,296 | 10/1984 | Nair | 75/0.5 A |
| 4,514,321 | 4/1985 | Siuta | 252/512 |
| 4,540,604 | 9/1985 | Siuta | 427/96 |

FOREIGN PATENT DOCUMENTS 62-2405  8/1987  Japan.

*Primary Examiner*—Ellis P. Robinson
*Assistant Examiner*—P. J. Ryan
*Attorney, Agent, or Firm*—Sprung Horn Kramer & Woods

[57] ABSTRACT

A non-oxidizing cooper thick film conductor comprising copper, said copper comprising metallic copper powder and copper oxide powder and applied to said copper are a manganese boron compound, an inorganic phosphate-containing acid and an organic vehicle, wherein the manganese boron compound ranges from 0.5 to 1.5 weight %, based on the total conductor weight and wherein the amount of phosphate is 50 to 300 ppm based on the weight of the metallic copper powder.

9 Claims, No Drawings

NON-OXIDIZING COPPER THICK FILM CONDUCTORS

BACKGROUND OF THE INVENTION

1. Field of the Invention

The present invention concerns a nitrogen fireable non-oxidizing copper, easily solderable thick film conductor.

2. Background Information

In the hybrid microelectronics industry there is great impetus to develop base metal conductor inks. In contrast to noble metals, copper not only reduces the cost, but has better electrical properties than most of the precious metal counterparts. The adoption of copper has been slow for a few reasons, namely, availability of compatible resistors, the need for new capital equipment investment and difficulty in processing. This invention addresses the latter of these points.

U.S. Pat. No. 4,514,321 and U.S. Pat. No. 4,540,604 to Siuta discusses copper compositions that include reducing agents for copper oxide.

U.S. Pat. No. 4,072,771 to Grier, Sr. concerns a conductor composition that relies on preoxidized copper particles.

U.S. Pat. No. 4,323,483 to Rellick relates to fritless copper conductor compositions that are useful for forming microwave conductors.

U.S. Pat. No. 3,988,647 to Bolon et al discloses a copper conduct composition that uses oxide-free copper particles.

U.S. Pat. No. 4,070,518 to Hoffman is directed to a copper conductor which contains a frit which is lead-free and bismuth-free.

U.S. Pat. No. 4,172,919 to Mitchell relates to copper conductors with high bismuth-containing glasses.

Japanese 62-2405 to Matsushita Elec. Ind. KK discloses thick film copper conduct compositions which include copper powder, manganese oxide, copper oxide and glass.

U.S. Pat. No. 3,929,674 to Patterson concerns noble metal (Pt, Pd, Au, Ag) thick film conductor compositions with improved properties when containing aluminum boride and/or other borides or silicides.

U.S. Pat. No. 4,090,009 to Horowitz concerns electrical conductors made with Pd/Ag, and an inorganic binder. The binder must be free of bismuth oxide to reduce staining at conductor/resistor interfaces.

U.S. Pat. No. 4,001,146 to Horowitz relates to electrical conductors containing (a) metal powder comprising silver or a mixture of silver with Pt, Pd, Au or an alloy of Cu with one or more of Pt, Pd, Au and Ag and (b) a glass-free inorganic binder containing bismuth oxide and oxides of copper and/or lead.

U.S. Pat. No. 3,881,914 to Heiderlberg concerns the use of a phosphate-containing acid as a reducing agent for copper oxide.

Heretofore, there has not been a copper conductor having simultaneously the properties of good adhesion, good solderability and good conductivity even after multiple firings, with the additional property of being non-oxidizing.

As a fired conductor awaits further processing its surface usually changes due to environmental conditions, i.e., oxidizes. This can cause problems in subsequent operations such as soldering and ultimately component attachment.

Heretofore, expensive precious metals were used instead of copper because such metals do not suffer from oxidation after a short period. Alternatively, when copper was used, it had to be processed very quickly.

SUMMARY OF THE INVENTION

It is an aim of the present invention to provide a copper thick film conductor which has good adhesion and is solderable and which does not exhibit degraded solderability after long storage times at ambient conditions, high temperature at about 50° C. or short term exposure to humidity.

It is a further aim of the present invention to provide a copper thick film conductor which allows for the complete sintering of copper particles and thus minimizes the number of grain boundaries, which further leads to avoidance of undesired oxidation of the copper.

The above aims and objects and other advantages are provided by the present invention which concern a non-oxidizing copper thick film conductor comprising copper, the copper comprising metallic copper powder and copper oxide powder and applied to the copper are a manganese boron compound, an inorganic phosphate-containing acid and an organic vehicle, wherein the manganese boron compound ranges from 0.5 to 1.5 weight %, based on the total conductor weight and wherein the amount of phosphate is 50 to 300 ppm based on the weight of the metallic copper powder.

DETAILED DESCRIPTION OF THE INVENTION

The present invention serves to overcome the problems of the prior art by providing the fired copper film with a clean metallic surface that is not prone to oxidation and is solderable after extended periods of time at room temperature conditions or 50° C. aging for 72 hours or 85% RH/85° C. for 24 hours. The compositions also have good long term aged (150° C.) adhesion to alumina substrates.

The key materials which give this property to the fired copper film are manganese boride ($MnB_2$) or manganese borate and an inorganic phosphate-containing acid such as hypophorous acid ($H(H_2PO_2)$) or orthophosphoric acid ($H_3PO_4$).

The thick film ink of the present invention contains finely divided particles of (a) metallic copper, coated with a monolayer of an inorganic phosphate-containing acid, (b) cuprous or cupric oxide, (c) manganese boride or manganese borate, and (d) other additives such as follows: glass frits, bismuth oxide, lead dioxide, antimony oxide or precious metal powders. All of the above is dispersed in an organic vehicle.

The physical characteristics of the copper powder are important for the fired film to have key properties such as adhesion, solderability and high conductivity. The oxide content of the copper powder is important for proper burnout of the organic vehicle as described in U.S. Pat. No. 4,514,321.

A typical particle size (sedigraph) is as follows:

90% less than 4–9.0 microns

50% less than 2–7.0 microns

10% less than 1–3.0 microns.

The surface area (BET MONOSORB) can range from 0.50 to 1.20 $M^2/g$. BET MONOSORB is a method of measuring surface area of a powder. It involves determining the volume of gas necessary to coat the powder with a monolayer of the adsorbed gas and from the molecular diameter the surface area is calculated.

The tap density can range from 2.5 to 4.2 g/cm$^3$.

The copper oxide powder content can range from 4 to 10 weight %, preferably 5 to 8 weight %, based on the total conductor composition weight.

It is preferred that the metallic copper powder have a monolayer of the inorganic phosphate-containing acid. Preferably at least 70% of the total metallic copper powder has an inorganic phosphate coating thereon.

The physical characteristics of the copper oxide powder are important for good adhesion solderability and vehicle burnout. At a 900° C. firing temperature, copper oxide can react with the alumina substrate to form $CuAlO_4$, thus forming an adhesive bond. Too little copper oxide gives poor adhesion, whereas too much decreases solderability. It is preferred in this invention that the copper oxide powder be of the form cupric oxide CuO. This compound decomposes in a nitrogen atmosphere to $Cu_2O$

$$(CuO \xrightarrow{N_2} \tfrac{1}{2}Cu_2O + \tfrac{1}{2}O_2 \uparrow)$$

at a temperature of about 700° C. The released oxygen helps burnout (oxidize) the organic vehicle and renders the local atmosphere less reducing. This means the conductors become less sensitive to processing conditions such as loaded belts.

A preferred particle size range for the copper oxide is as follows:

90% less than 3.0–8.0 microns
50% less than 1.5–4.0 microns
10% less than 1.0–2.5 microns.

A preferred surface area range for the copper oxide is 2 to 6 m$^2$g.

The manganese boron compounds, e.g., manganese boride or manganese borate, in combination with the inorganic phosphate acid are what gives the fired films their non-oxidizing surface and adhesion. The amount of manganese boron compound to be used according to the present invention is 0.5 to 1.5 weight % of the total conductor composition weight, preferably 0.7 to 1.2% of the total conductor composition weight. X-ray diffraction analysis have shown that $MnB_2$ reduces copper oxide to copper metal after firing at 900° C. in a nitrogen atmosphere. Based on this result the following reaction is assumed to occur:

$$MnB_2 + 3CuO \rightarrow 6Cu + Mn + B_2O_3.$$

Without wishing to be bound by any particular theory of operability, the manganese is believed to act as a liquid phase sintering aid to help densify the copper film. Concurrently, the phosphate acid is believed to undergo the following type of reaction:

$$2H(H_2PO_2) + Cu_2O \rightarrow 2Cu + P_2O_5 + 2H_2O \uparrow \text{ or}$$

$$2H_3PO_4 \rightarrow 3H_2O + P_2O_5.$$

The $P_2O_5$ and $B_2O_3$, both good glass formers are believed to combine to form a low melting glass which serves two key purposes, namely as follows:

(1) It dissolves $Cu_2O$, thus accelerating the kinetics of the formation of $CuAl_2O_4$.
(2) It migrates to the surface of the conductor to form a protective layer. This protective layer helps prevent oxidation of the fired conductor surface. During the soldering operation it is easily dissolved and enables the clean copper surface to be wetted by solder.

The preferred surface area for the manganese boron compound is 0.5 to 3.0 m$^2$/g.

Any phosphate acid such as phosphoric or phosphorus acids will give the desired effect. Phorphorus acids are preferred since they are reducing to copper oxide and if added as a coating on the copper powder will keep it from oxidizing before firing and before it is incorporated into a thick film ink.

The following phosphoric and phosphorous acids can be used in the present invention:

| Phosphoric Acids | | Phosphorus Acids | |
|---|---|---|---|
| Hypo | $H_4P_2O_6$ $2H_2O$ | Hypo | $H(H_2PO_2)$ |
| meta | $HPO_3$ | meta | $HPO_2$ |
| ortho | $H_3PO_4$ | ortho | $H_2(HPO_3)$ |
| | | pyro | $H_4P_2O_6$ |
| difluoro | $H_2PO_2F_2$ | | |

The preferred amount of phosphate is 50 to 300 ppm and most preferably 70 to 150 ppm, based on the weight of the metallic copper powder.

Other inorganic additives that can be employed in the present invention are any additives well known in the art for making thick film conductors, such as silver, glass frits, bismuth oxide, lead oxide, etc. The physical characteristics of such additives are not critical.

Glass frits for use in the present invention are those commonly used in thick film inks. These are typically in the lead borosilicate family with modifiers such as ZnO, $Bi_2O_3$, $Al_2O_3$, CdO, $TeO_2$, CuO, $Cu_2O$, $TiO_2$, $Na_2O$, CaO, SrO and BaO.

Non-limiting examples of other additives for use in the present invention are oxides that promote adhesion, i.e., form a spinel type compound with the alumina substrate, e.g., NiO, MgO, MnO, ZnO and CdO. Other additives that can be utilized in the present invention are those that act as glass fluxing agents, such as PbO and $Bi_2O_3$. Materials which aid burnout of the organic vehicle such as $PbO_2$ or $BaO_2$ $Ba(NO_3)_2$ or $Pb(NO_3)_2$ can also be employed as additives in the present invention.

A suitable organic vehicle for use in the present invention would be an organic vehicle which cleanly volatilizes at a fairly low temperature (approximately 400° C. to 500° C.). Any inert liquid which meets this criteria can be used.

Various organic liquid with or without thickening and/or stabilizing agents and/or other additives may be used in the present invention. Examplary of organic liquids which can be used in the present invention are alcohols having 8 to 15 carbon atoms and esters of alcohols. Non-limiting examples of such alcohols are as follows: alcohol, "TEXANOL" and terpineol. Other organic liquids that can be used in the present invention include terpenes such as pine oil; phthalates, such as dibutyl, dioctyl, dimethyl or dibutyl ethyl. The primary purpose of the vehicle is to aid in transfer through the screen during the printing process. These organic liquids must have low enough vapor pressure to remain on the screen for a few hours with minimal evaporation leading to a thickening of the ink and therefore poor transfer and subsequent printing problems. The organic liquids, either by themselves or in any particular combination, must dissolve or cause the resin to gel. The resin should be an acrylic ester resin and/or ethyl cellulose, although any resin that provides good screen printing characteristics with the appropriate organic liquid can be used in the present invention.

The invention will now be described with reference to the following non-limiting examples.

Examples A to M are summarized in Table 1. The following is a brief summary of the examples.

GENERAL PROCEDURE FOR THE EXAMPLES

The inorganic powders used in the Examples were dispersed in an organic medium by mechanical mixing, first with a Hobart planetary mixer and then with a three roll-mill. The degree of dispersion was determined by use of a Hegman gauge. This instrument consists of a channel in a block of steel whose depth varies from 25 microns to 0. Ink is spread over the channel. A blade drawn over this channel causes scratches to appear in the paste where the agglomerate size of the ink is greater than the depth. Typically a well dispersed paste will give a 50% point (defined where the channel is half covered with scratches) of less than 12 microns.

The dispersed ink was then screen printed onto an alumina substrate. After drying at 110° C.–130° C. for about 10 minutes to remove the solvents, the part was put into a belt furnace. The belt furnace had a controlled temperature profile which usually peaked at 900° C.±10° C. The total firing time lasted from 40 to 70 minutes. This furnace, to protect the copper from gross oxidation, contained a non-oxidizing, typically $N_2$ atmosphere, with 1–20 ppm oxygen. The firing step was conducted to sinter or densify the particular powders and to cause chemical reactions to occur to affect the final properties, such as adhesion, solderability and conductivity.

After firing, the parts were tested for their properties. Adhesion was measured by attaching twenty gauge-pretinned wires to an 80 mil×80 mil pad by solder dipping for 10 seconds in 62 Sn/36 Pb/2Ag or 63 Sn/37Pb solder at temperatures from 220° C. to 230° C. using "Alpha 611" flux ("Alpha 611" is a tradename for solder flux made by Alpha Metals Inc., Jersey City, N.J., U.S.A.).

The wires were then bent at a 90° angle from the substrate and pulled until they released from the substrate. The force needed to release the wire is called the adhesion. Aged adhesion was done as above, but after the soldered parts were put in an oven at 150° C. for 100 hours.

Solderability was determined by dipping the parts in solder, preheating the parts for 10 seconds on top of the molten solder and then submerging the part for 10 seconds in the solder. The part was withdrawn, cleaned and then inspected. Solderability was determined by the percent of solder coverage obtained on an 80×80 mil pad.

The surface of the fired copper part was inspected visually before and after aging at 150° C. for 48 hours. If the color remained unchanged, the part was unoxidized. If a reddish brown or any discoloration appeared, the part was referred to as oxidized.

EXAMPLE A

This is an example with an inorganic phosphate coating on the copper powder, $MnB_2$.
Note: unoxidized surface, excellent solderability and adhesion.

EXAMPLE B

No coating on the copper powder, $MnB_2$.
Note: poor adhesion and oxidized surface.

EXAMPLE C

Organic coating on the copper powder, $MnB_2$.
Note: poor adhesion and oxidized surface.

EXAMPLE D

Inorganic phosphate coating on the copper powder, no $MnB_2$.

EXAMPLES A TO D

Examples A to D clearly show that both an inorganic phosphate coating and $MnB_2$ are necessary for all three properties: solderability, adhesion and unoxidized surface.

EXAMPLE E

Inorganic phosphate coating on the copper powder, B.
Note: poor adhesion, oxidized surface.

EXAMPLE F

Inorganic phosphate coating on the copper powder, $MnO_2$.
Note: oxidized surface.

EXAMPLE G

Inorganic phosphate coating on the copper powder, $Ni_3B$.
Note: oxidized surface

EXAMPLES E TO G

Examples E to G show that only $MnB_2$ gives a nonoxidized surface.

EXAMPLE H

Inorganic phosphate coating on the copper powder, large amount of $MnB_2$: 2%.
Note: poor adhesion.
This example establishes the upper limit for $MnB_2$.

EXAMPLE I

Inorganic phosphate coating on the copper powder, $MnB_2$, Ag.
Note: Excellent solderability, adhesion and non-oxidized surface.

EXAMPLE J

Inorganic phosphate coating on the copper powder, $MnB_2$, glass frit
Note: good solderability, adhesion, non-oxidized surface.

EXAMPLE K

Inorganic phosphate coating on the copper powder, $MnB_2$, $PbO_2$
Note: excellent solderability, adhesion and non-oxidized surface.

EXAMPLES H TO K

Examples H to K establish the fact that other additives can be used.

EXAMPLE L

80% inorganic phosphate coating on the copper powder, 20% no coating copper powder, MnB$_2$.

Note: excellent adhesion, solderability.

Example L demonstrates that excellent properties can be achieved even with only 80% of the copper powder having an inorganic phosphate coating.

TABLE 1

| Sample Weight % | A | B | C | D | E | F | G | H | I | J | K | L |
|---|---|---|---|---|---|---|---|---|---|---|---|---|
| Copper (Phosphate Coating) | 81.52 | — | — | 80.99 | 79.50 | 79.00 | 79.00 | 78.50 | 80.94 | 79.00 | 63.15 | 65.15 |
| Copper (No Coating) | — | 81.52 | — | — | — | — | — | — | — | — | 15.79 | 16.28 |
| Copper (Organic Coating) | — | — | 81.52 | — | — | — | — | — | — | — | — | — |
| Copper (Other) | — | — | — | — | — | — | — | — | — | — | — | — |
| CuO | 6.19 | 6.19 | 6.19 | 6.15 | 7.00 | 7.00 | 7.00 | 7.00 | 6.15 | 7.00 | 7.76 | 6.00 |
| MnB$_2$ | 0.90 | 0.90 | 0.90 | — | — | — | — | 2.00 | 0.90 | 1.00 | 1.00 | 1.00 |
| Ag | — | — | — | — | — | — | — | — | 0.7 | — | — | — |
| Glass | — | — | — | — | — | — | — | — | — | 1.00 | — | — |
| MnO$_2$ | — | — | — | — | — | 1.0 | — | — | — | — | — | — |
| B | — | — | — | — | 0.50 | — | — | — | — | — | — | — |
| Ni$_3$B | — | — | — | — | — | — | 1.00 | — | — | — | — | — |
| PbO$_2$ | — | — | — | — | — | — | — | — | — | — | 3.00 | — |
| Vehicle | 11.39 | 11.39 | 11.39 | 12.86 | 13.00 | 13.00 | 13.00 | 12.50 | 11.31 | 12.00 | 9.30 | 11.57 |
| Solderability | Exc | — | — | Good | Exc | Exc | Good | Poor | Exc | Exc | Exc | Exc |
| Adhesion (Initial/Aged) | 7.3/4 | 0 | 0 | 2.9/1.2 | 1.7/1.4 | 4.2/3.9 | 2.5/2.0 | 1.6/0 | 7.3/3.3 | 7.1/3.6 | 7.8/4.3 | 8.1/4.0 |
| Surface | U$_n$ | O$_x$ | O$_x$ | O$_x$ | O$_x$ | O$_x$ | O$_x$ | U$_n$ | U$_n$ | U$_n$ | U$_n$ | U$_n$ |

Exc = Excellent
U$_n$: unoxidized
O$_x$: oxidized

It will be appreciated that the instant specification and claims are set forth by way of illustration and not limitation and that various modifications and changes may be made without departing from the spirit and scope of the present invention.

What is claimed is:

1. A non-oxidizing copper thick film conductor comprising copper, said copper comprising metallic copper powder having a surface area of 0.50 to 1.20 m$^2$/g and a tap density of 2.5 to 4.2 b/cm$^2$ and copper oxide powder, wherein the copper oxide ranges from 4 to 10 weight % of the total conductor weight and applied to said copper are a manganese boron compound selected from the group consisting of manganese boride and manganese borate, an inorganic phosphate-containing acid selected from the group consisting of hypophorous acid, metaphorous acid, orthophorous acid, pyrophorous acid, hypophosphoric acid, metaphosphoric acid, orthophosphoric acid and difluorophosphoric acid and an organic vehicle, wherein the manganese boron compound ranges from 0.5 to 1.5 weight %, based on the total conductor weight and wherein the amount of phosphate is 50 to 300 ppm based on the weight of the metallic copper powder.

2. A copper thick film conductor according to claim 1, wherein the copper oxide powder is selected from the group consisting of cuprous and cupric oxide.

3. A copper thick film conductor according to claim 2, wherein the metallic copper is coated with a monolayer of the inorganic phosphate-containing acid.

4. A copper thick film conductor according to claim 3, wherein at least 70% of the total metallic copper has the inorganic phosphate coating thereon.

5. A copper thick film conductor according to claim 2, wherein the copper oxide ranges from 5 to 8 weight % of the total conductor weight.

6. A copper thick film conductor according to claim 2, wherein the copper oxide has a surface area of 2 to 6 m$^2$/g.

7. A copper thick film conductor according to claim 1, wherein the manganese boron compound has a surface area of 0.5 to 3.0 m$^2$/g.

8. A copper thick film conductor according to claim 1, wherein the manganese boron compound ranges from 0.7 to 1.2 weight %, based on the total conductor weight.

9. A copper thick film conductor according to claim 1, wherein the amount of phosphate is 70 to 150 ppm based on the weight of the metallic copper powder.

* * * * *